United States Patent [19]
Heck et al.

[11] Patent Number: 5,483,691
[45] Date of Patent: Jan. 9, 1996

[54] ZERO INTERMEDIATE FREQUENCY RECEIVER HAVING AN AUTOMATIC GAIN CONTROL CIRCUIT

[75] Inventors: Joseph P. Heck, Ft. Lauderdale; Enrique Ferrer, Miami, both of Fla.

[73] Assignee: Motorola, Inc., Schaumburg, Ill.

[21] Appl. No.: 275,088

[22] Filed: Jul. 14, 1994

Related U.S. Application Data

[63] Continuation of Ser. No. 895,309, Jun. 8, 1992, abandoned.

[51] Int. Cl.[6] .......................................................... H04B 1/16
[52] U.S. Cl. ................... 455/234.2; 455/209; 455/241.1; 455/245.2; 375/345
[58] Field of Search ............................ 455/234.1, 234.2, 455/236.1, 239.1, 241.1, 251.1, 253.2, 245.1, 245.2, 315, 324; 330/278; 375/345

[56] References Cited

U.S. PATENT DOCUMENTS

| | | | |
|---|---|---|---|
| 3,986,124 | 10/1976 | Mitchell, Jr. | 455/137 X |
| 4,403,346 | 9/1983 | Ogawa | 455/251.1 |
| 4,580,288 | 4/1986 | Rinderle | 455/239.1 |
| 4,736,390 | 4/1988 | Ward et al. | 455/324 X |
| 4,827,511 | 5/1989 | Masuko | 455/242.2 |
| 4,850,038 | 7/1989 | Shibata et al. | 455/315 |
| 4,876,741 | 10/1989 | Jacobs et al. | 455/234.2 |

*Primary Examiner*—Edward F. Urban
*Attorney, Agent, or Firm*—Pedro P. Hernandez; Barbara R. Doutre

[57] ABSTRACT

A receiver automatic gain control (AGC) circuit includes a first adjustable gain control amplifier (158) which is responsive to a gain control signal (156). The AGC circuit further includes a second adjustable gain control amplifier (114) and a control circuit (116) which receives the gain control signal (156) and provides a modified gain control signal or VCNTRL (152) to the second adjustable control amplifier (114). The control circuit (116) also limits the amount of gain control applied to adjustable gain control amplifiers (114 and 118) when the gain control signal (156) reaches a certain predetermined level. This provides for all further gain reduction to occur at the first adjustable gain control amplifier (158) and thereby reduce the chances for distortion under high input signal conditions.

8 Claims, 7 Drawing Sheets

ZERO INTERMEDIATE FREQUENCY RECEIVER HAVING AN AUTOMATIC GAIN CONTROL CIRCUIT

This is a continuation of application Ser. No. 07/895,309, filed Jun. 6, 1992 and now abandoned.

TECHNICAL FIELD

This invention relates generally to radio communication receivers, and more specifically to a radio communication receiver automatic gain control (AGC) system.

BACKGROUND

In radio frequency (RF) receivers containing integrated active filter stages such as zero intermediate frequency receivers (ZIF receiver), automatic gain control (AGC) circuit is typically employed. The function of the AGC circuit is to control the signal level to the active filter stages in the receiver so the signal is not driven in to limit (clipping) conditions. Automatic gain control circuits attempt to keep the output level of the receiver constant regardless of received input signal strength. Typically, the receiver gain is regulated in inverse proportion to the signal strength of the received signal.

In order to protect from signal over-drive conditions in a multi-stage active filter arrangement such as found in a ZIF receiver, the stage under gain control is usually selected as one of the first stages in the receiver path. This less than optimum implementation of an AGC system results in a decrease in the maximum signal-to-noise ratio whenever large input signals are present at the receiver's front-end. This decrease in signal to noise ratio is caused by the fact that the noise floor does not decrease as much as the signal level when AGC is applied. In other words, the decrease in signal to noise ratio is caused by a reduction in system takeover by tile AGC circuit.

In other prior art AGC systems gain reduction has been applied to multiple amplifier stages simultaneously in order to control multiple stages of a receiver to avoid signal distortion. A good example of such a system can be found in U.S. Pat. No. 4,850,038 entitled "Frequency converter" by Shibata et al. Unfortunately, under strong input signal conditions such as when a pair of transceivers are communicating with each other at a close distance, even prior art systems that rely on multiple AGC controlled stages have problems with signal distortion due to signal clipping. A need thus exists for a communication receiver AGC system which can provide for improved maximum signal to noise ratios even under large received input signal conditions.

SUMMARY OF THE INVENTION

Briefly, according to the invention, an automatic gain control circuit comprises a first adjustable gain stage having an input terminal for receiving an input signal, the first adjustable gain stage being responsive to a gain control signal for adjusting the amount of gain provided to the input signal by the first adjustable gain stage. The first adjustable gain control stage is coupled to a second adjustable gain control stage for further amplifying the input signal. The second adjustable gain control stage is in turn coupled to a control means responsive to the gain control signal for providing a modified gain control signal to the second adjustable gain stage for adjusting the gain of the second adjustable gain stage, the control means further including a limiting means for limiting the gain reduction applied to the second adjustable gain stage upon the gain control signal reaching a predetermined gain reduction limit threshold level. Thereby providing for an automatic gain control circuit which provides for improved signal to noise ratios.

DETAILED DESCRIPTION OF THE PREFERRED EMBODIMENT

Figure 1:
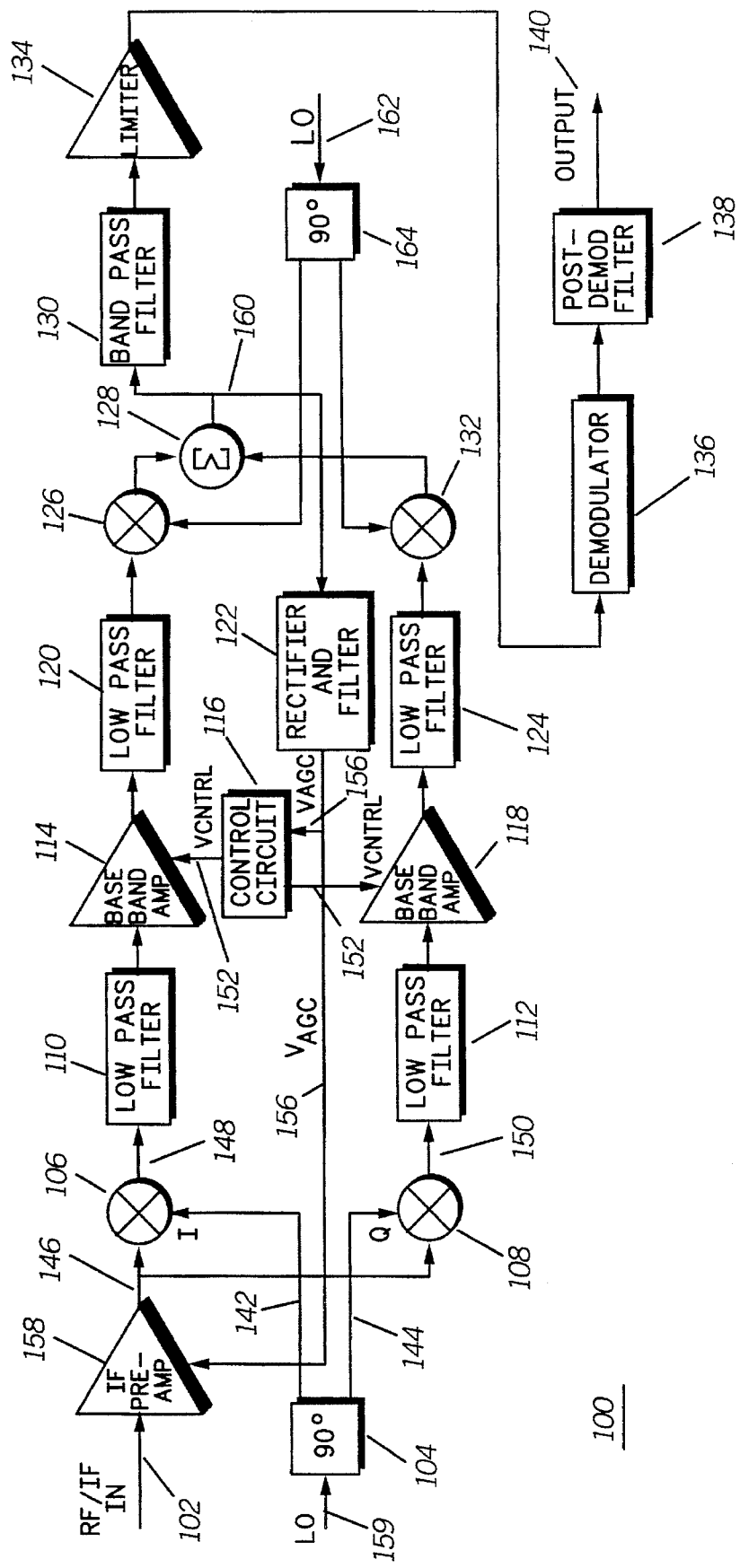
FIG. 1 is a block diagram of a zero IF receiver circuit according to the present invention.

Referring now to the drawings and specifically to FIG. 1, there is shown a simplified block diagram of a ZIF receiver system 100 utilizing an automatic gain control (AGC) system in accordance with the present invention. The AGC system of the present invention consists of a set of adjustable gain base band amplifiers 114 and 118, an adjustable gain IF pre-amplifier 158, and a control circuit 116 for controlling the gain of the baseband amplifiers.

A first amplifier stage such as a gain adjustable IF pre-amplifier 158 receives a radio frequency (RF) or intermediate frequency (IF) signal 102, which it amplifies and applies to down-mixers 106 and 108. A phase-shifting circuit 104 receives a local oscillator (L.O.) wave-form 159 and produces an in-phase waveform (I) 142 and a quadrature waveform (Q) 144. The (I)142 and (Q) 144 signals being 90 degrees out of phase with respect to each other. The (I) 142 and (Q) 144 signals are applied to down mixers 106 and 108 for multiplication with the input signal 146. Down mixers 106 and 108 then converts the signal from the RF or IF to baseband frequency. Lowpass filters 110 and 112 filter the baseband signals to remove interference and limit the noise bandwidth of the receiver 100. Lowpass filters 110 and 112 are coupled to a second amplifier stage such as a pair of adjustable gain base band amplifiers 114 and 118 which are under gain control by a control means such as control circuit 116. The output of the baseband amplifiers is filtered by lowpass filters 120 and 124. The filtered signals are sent to up-conversion mixers 126 and 132 which convert the baseband signals up to a convenient frequency for further processing and demodulation.

Inphase and quadrature reference signals are supplied by phase shifting circuit 164 which receives LO signal 162. In the preferred embodiment the signal is mixed to a center frequency of 131.250 Khz. An adder circuit 128 adds the signals coming from up mixers 126 and 132. A bandpass filter 130 then filters the signal 160 produced by adder 128. Limiter circuit 134 limits the signal produced by the filter for demodulation by a demodulator 136. A post-demodulator filter 138 filters the demodulated signal prior to the signal being presented to a listener.

The 131.250 Khz signal 160 is also rectified and filtered by a conventional rectifier and filter circuit 122 which generates a gain control signal such as a dc voltage (VAGC) 156 having a magnitude proportional to the receiver input signal power. The gain control signal (VAGC) 156 is used to control the gain of IF preamplifier 158. The AGC control voltage (VAGC) 156 is also processed through control circuit 116 which generates a modified gain control signal such as a modified gain control voltage (VCNTRL) 152 which in turn controls the gain of base band amplifiers 114 and 118.

Using control circuit 116 to control the amount of gain reduction (or amplification) allowed by the second amplifier stage (baseband amps 114 and 118) relative to the gain reduction applied to the first stage (IF preamp 158) allows for protection of the stages preceding baseband amps 114 and 118 from signal overdrive, without compromising signal to noise ratio in high receive signal conditions. By utilizing two gain control stages and having one stage being controlled with respect to the gain applied to the other stage, allows for a reduction in the noise floor at the IF output. Control circuit 116 also includes a limiting means for limiting the amount of gain reduction applied to baseband amplifiers 114 and 118 when the VAGC signal 156 reaches a predetermined level, this allows for any further gain reduction in the receiver to take place at the IF preamplifier 158. Although FIG. 1 has been shown as a ZIF receiver other receiver architecture's such as dual conversion receivers, etc. can utilize the present invention.

Figure 2:
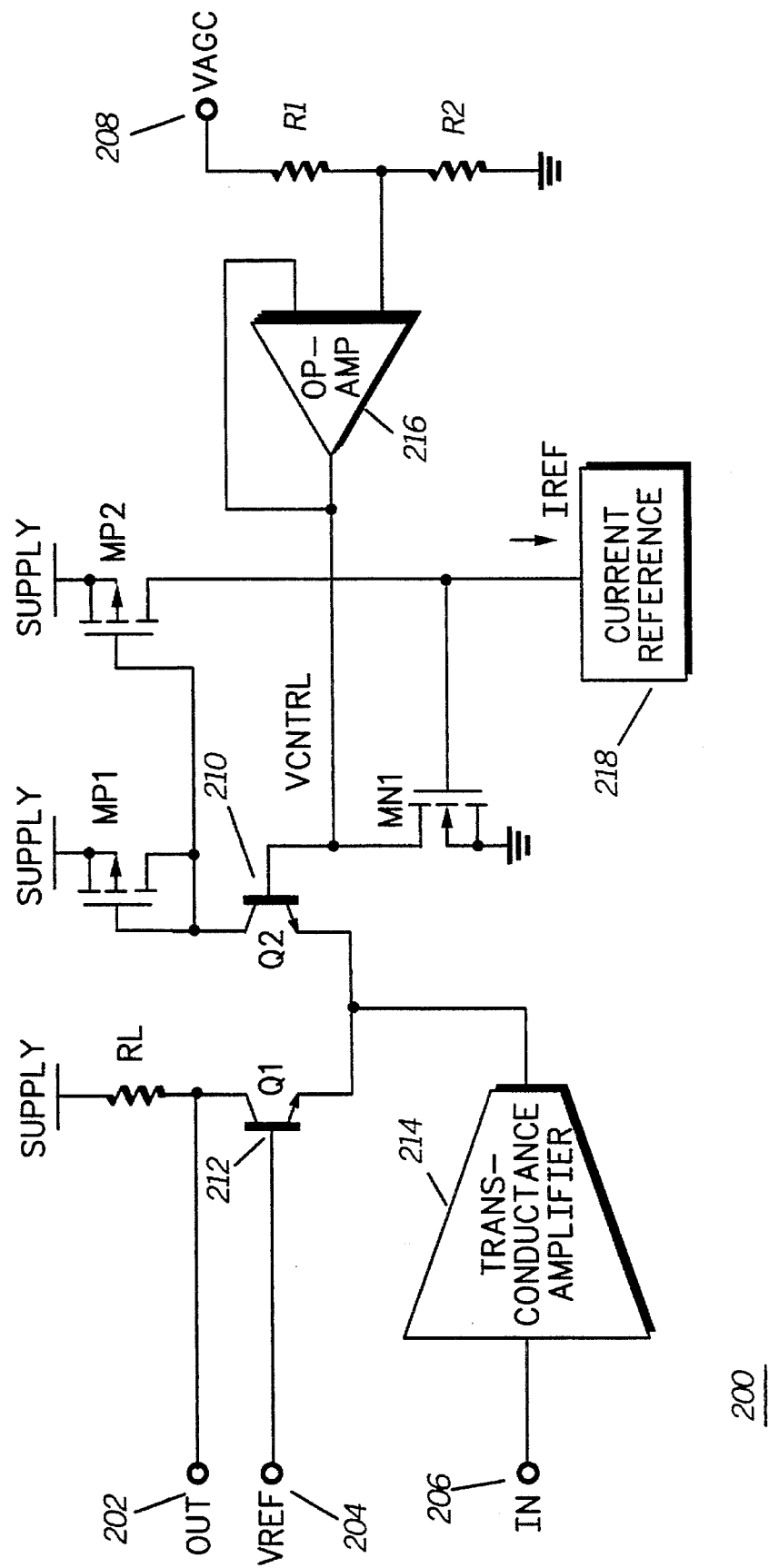
FIG. 2 is a simplified diagram of a base band amplifier and control circuit in accordance with the invention.

A simplified schematic of the base band amplifier 114 (base band amplifier 118 is not shown for simplicity) and control circuit 116 is shown in FIG. 2. The adjustable gain base band amplifier is similar to amplifiers 114 and 118 shown in FIG. 1 and consists of a transconductance amplifier 214, transistors 212 and 210 (Q1 and Q2) and a load RL. The baseband amplifier section includes an input terminal 206 and an output terminal 202. In the preferred embodiment voltage reference terminal 204 is set at approximately 2.75 volts. The VAGC (AGC DC voltage) 208 (voltage 156 in FIG. 1) is applied through a resistor divider circuit consisting of resistors R1 and R2 with the resulting voltage being applied to a low output current unity gain buffer 216.

As VCNTRL increases in voltage, current is taken away from transistor Q1 212 by transistor Q2 thereby reducing the gain of the base band amplifier. The current taken away by transistor Q2 210 is mirrored through FETs MP1 and MP2 and compared to the current reference Iref developed by circuit 218. When the current through transistor Q2 is equal to the current set by current reference 218, FET MN1 is turned on, preventing any further increase in VCNTRL voltage. Thereby, no further gain reduction is allowed from the base band amplifier. This in effect works as a limiting means preventing any further gain reduction to be applied to the baseband amplifiers. Both the resistor divider circuit R1/R2 and current reference 218 can either be fixed or dynamically adjustable by way of a microprocessor or other adjustment means.

Figure 3:
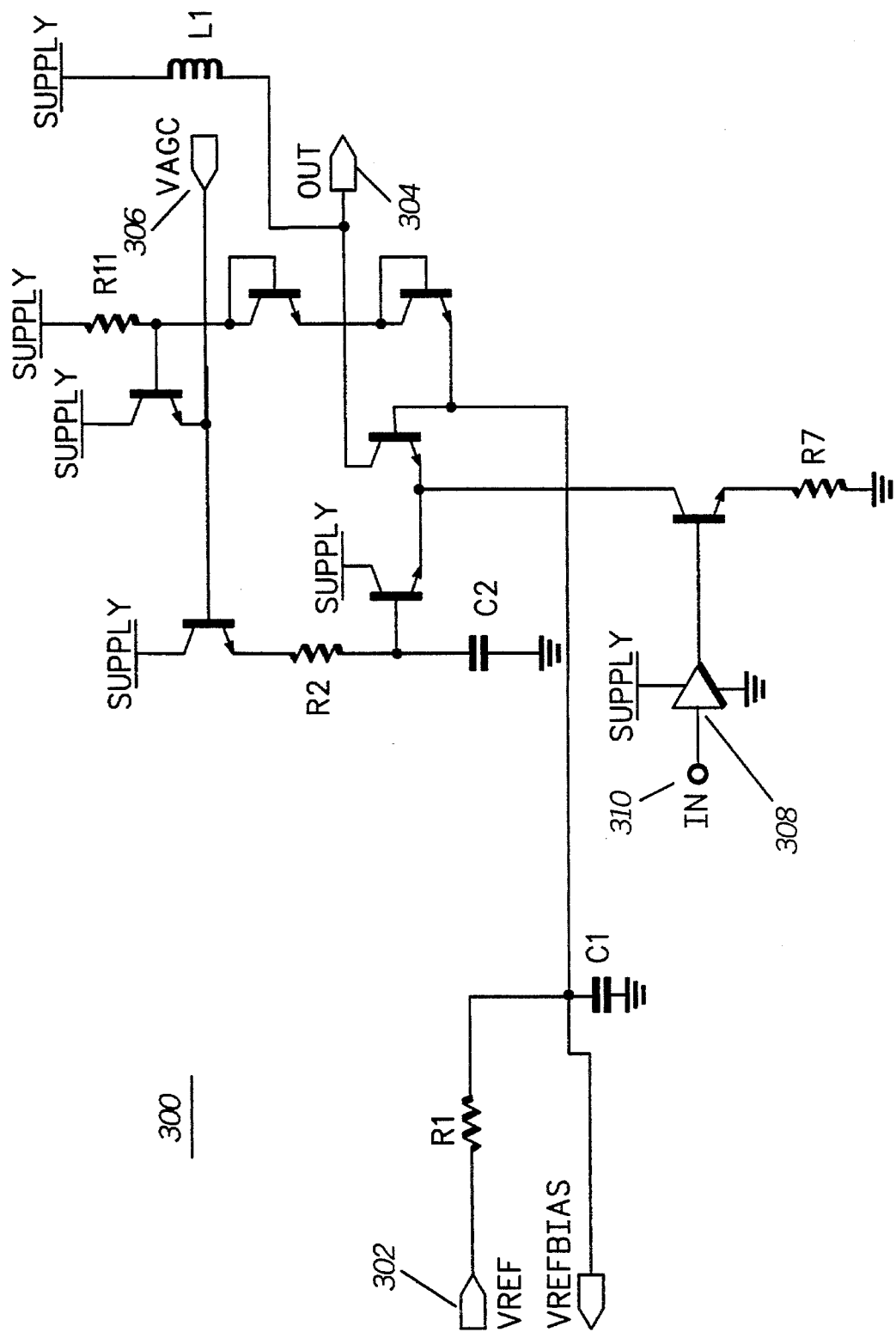
FIG. 3 is a schematic of an IF preamplifier in accordance with the invention.

In FIG. 3, a schematic of an IF preamplifier similar to IF preamp 158 of FIG. 1 is shown. Input terminal 310 (IN) allows for the reception of IF or RF signals into the amplifier 300. The gain control voltage (VAGC) provided by the rectifier circuit (circuit 122 in FIG. 1) is sent to terminal 306 for controlling the gain of the amplifier according to the VAGC voltage level which is applied. Output terminal 304 provides the amplified output signal (signal 146 in FIG. 1) to the next stage in the receiver circuit.

Control terminal 302, reference voltage terminals (VREF) sets the gain control threshold voltage for amplifier 300. Control terminal 302 can be under the control of a central controller such as a microprocessor or other control circuit.

Figure 4:
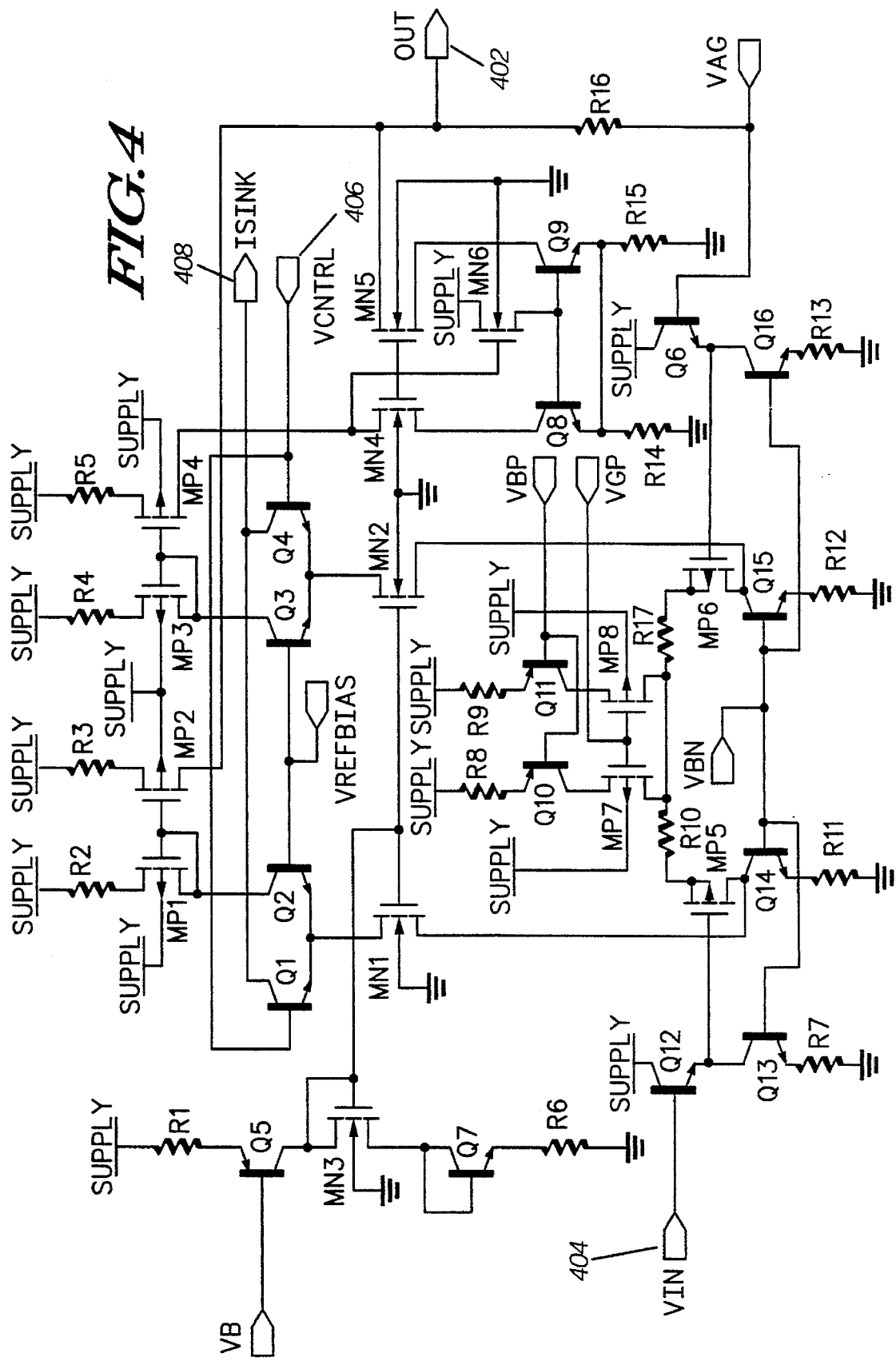
FIG. 4 is a schematic of a base-band amplifier in accordance with the invention.

In FIG. 4, a schematic of a baseband amplifier similar to baseband amplifiers 114 and 118 is shown. The baseband amplifier includes an input terminal (VIN) 404 and an output terminal (OUT) 402. Control terminal (VCNTRL) 406 receives a voltage level from tile control circuit (control circuit 116 in FIG. 1 ) in order to adjust the gain of the baseband amplifier. Several control terminals (VREFBIAS, VBP, VGP, VBN and VB) are also found in the baseband amplifier and are used to set the operating condition (bias points) for the baseband amplifier.

The base band amplifier consists of a voltage to current converter and a load resistor. FETs MP5 and MP6 are preferably of equal size and geometry, and form the input of the differential transconductance amplifier. Resistors R10 and R17 are also preferably of equal resistance value. Devices Q10, Q11, MP7, MP8, and resistors R8 and R9 form a 20 μA constant current source. Voltages VBP and VGP provide bias to this current source. Transistor Q14 and resistor R11 form a 20 μA constant current source. In the same way, transistor Q15 and resistor R12 also form a 20 μA constant current source. Voltage VBN provides bias to these two current sources. Transistors Q12, Q13, Q16, Q6 and resistors R7 and R13 form two level shifters. The base of transistor Q6 is biased to voltage VAG, and the input signal at the base terminal of transistor Q12 is DC coupled from the previous receiver stage at a quiescent voltage of value equal to VAG. Devices Q5, Q7, MN1, MN2, MN3 and resistors R1 and R6 form a bias network which keeps current source transistors Q14 and Q15 operating in the linear region. The current through transistors Q5, MN3 and Q7 is equal to 10 μA and is set by bias voltage VB at the base of transistors Q5. Under quiescent bias conditions (VIN=VAG) the currents through devices MN1 and MN2 are the same and are equal to approximately 10 μA. Transistors Q2 and Q3 have their base terminals biased at a voltage VREFBIAS. Devices Q1 and Q4 have their base terminals biased at a voltage VCNTRL.

When the voltage VCNTRL is substantially lower than the voltage VREFBIAS, transistors Q1 and Q4 are turned off, and no voltage gain reduction is applied at the base band amplifier. As the voltage VCNTRL increases, to approach the value of the voltage VREFBIAS, transistors Q1 and Q4 start taking current away from devices Q2 and Q3, which causes the gain of the base band amplifier to be reduced. FETs MP1, MP2 and resistors R2 and R3, form a first set of current mirrors. FETs MP3 and MP4 with resistors R4 and R5 form a second set of current mirrors. While devices Q8, Q9, MN4, MN5, MN6, R14 and R15 form a third set of current mirrors. The function of these three sets of current mirrors is to apply tile transconductance amplifier output current differentially to load R16.

The voltage gain of the amplifier (under no gain reduction) is given by:

$$Av = \frac{R16}{R10 + 1/gm}$$

where "gm" is the transconductance of device MP5.

Figure 5:
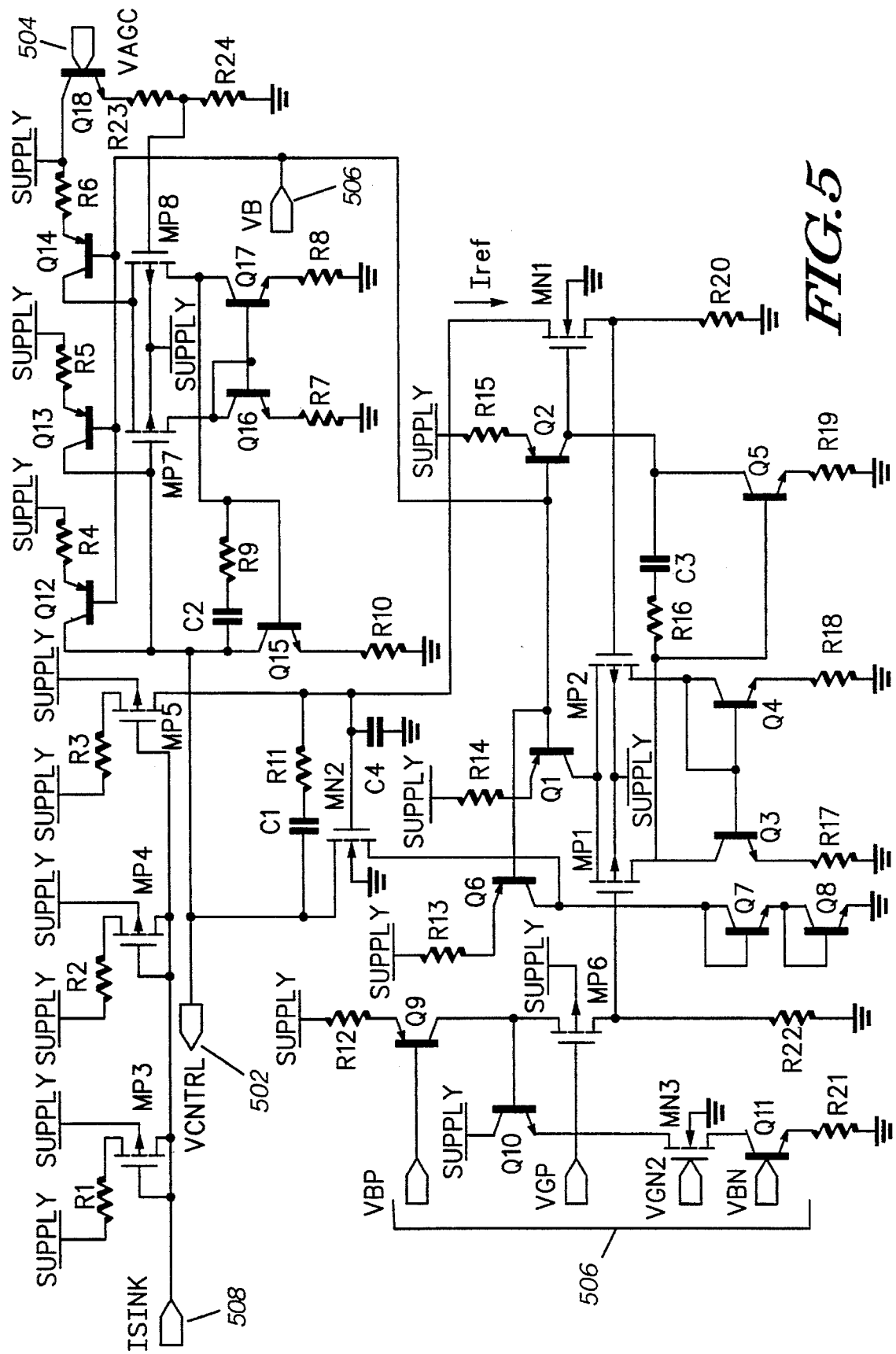
FIG. 5 is a schematic of a base-band control circuit in accordance with the present invention.

In FIG. 5, a schematic of control circuit 116 (shown in FIG. 1) according to the present invention is shown. Control circuit 116 comprises an operational amplifier connected as a unity gain follower, a current reference, a set of current mirrors, and a compensation network. The unity gain follower amplifier comprises bipolar devices Q12 through Q17, mosfets MP7–MP8, resistors R4 through R10 and a compensation capacitor C2. In the preferred embodiment the maximum output current source capability for the amplifier is set to equal approximately 20 μA.

The current reference section of control circuit 116 includes an operational amplifier (comprising bipolar devices Q1 through Q5, mosfets MP1–MP2, resistors R14 through R19 and compensation capacitor C3), an input constant current source (comprised of devices Q9, MP6 and resistor R12), an adjustment network (comprised of current source MN3, Q11 and R21, and transistor Q10), output FET MN1, and resistors R20 and R22.

The control circuit of FIG. 5 operates by first applying a constant current to resistor R22 at the positive input of the operational amplifier. The output of the operational amplifier is coupled to the gate terminal of the output device, while the source terminal of the output device is coupled to the operational amplifier's negative input terminal and also to resistor R20. Since the operational amplifier will maintain its two input terminals at the same value, the desired output current labeled "Iref" in FIG. 5 is set by the ratio of resistor R20 with respect to resistor R22. The adjustment network is used to subtract from the input constant current source, a current amount equal to the base current going into transistors Q2 and Q4 of the base band amplifier circuit of FIG. 4.

Mosfets MP3, MP4, MP5 and resistors R1, R2, and R3 form a two-to-one current mirror, which is used to mirror the current from the Isink terminal of the base band amplifier into the control circuit of FIG. 5. The current source comprised of transistors Q6, resistor R13, and diodes Q7 and Q8 provide bias voltage for mosfet MN2. Capacitors C1, C4 and resistor R11 form a compensation network to insure circuit stability. While voltages VB, VBP, VGP, VGN2 and VBN set the proper bias for the circuits current sources.

Input terminal (VAGC) 504 provides the input voltage from the receiver rectifier circuit, with the VAGC voltage level indicating the magnitude of the received signal. The output terminal 502 of the control circuit (VCNTRL) provides the gain control voltage for baseband amps 114 and 118. The amount of current reference (IREF) in turn sets the reference bias current which controls the maximum gain reduction that will be applied to baseband amplifiers 114 and 118 (e.g., the point where the gain reduction is clamped). The higher the current reference, the more gain reduction will be allowed to be placed on the baseband amplifiers before the gain reduction is clamped. Again, several bias point terminals 506 (VBP, VGP, VGN2, VBN and VB) set the operating bias level for the control circuit. These bias points are set at levels which depend on the operating characteristics desired.

Figure 6:
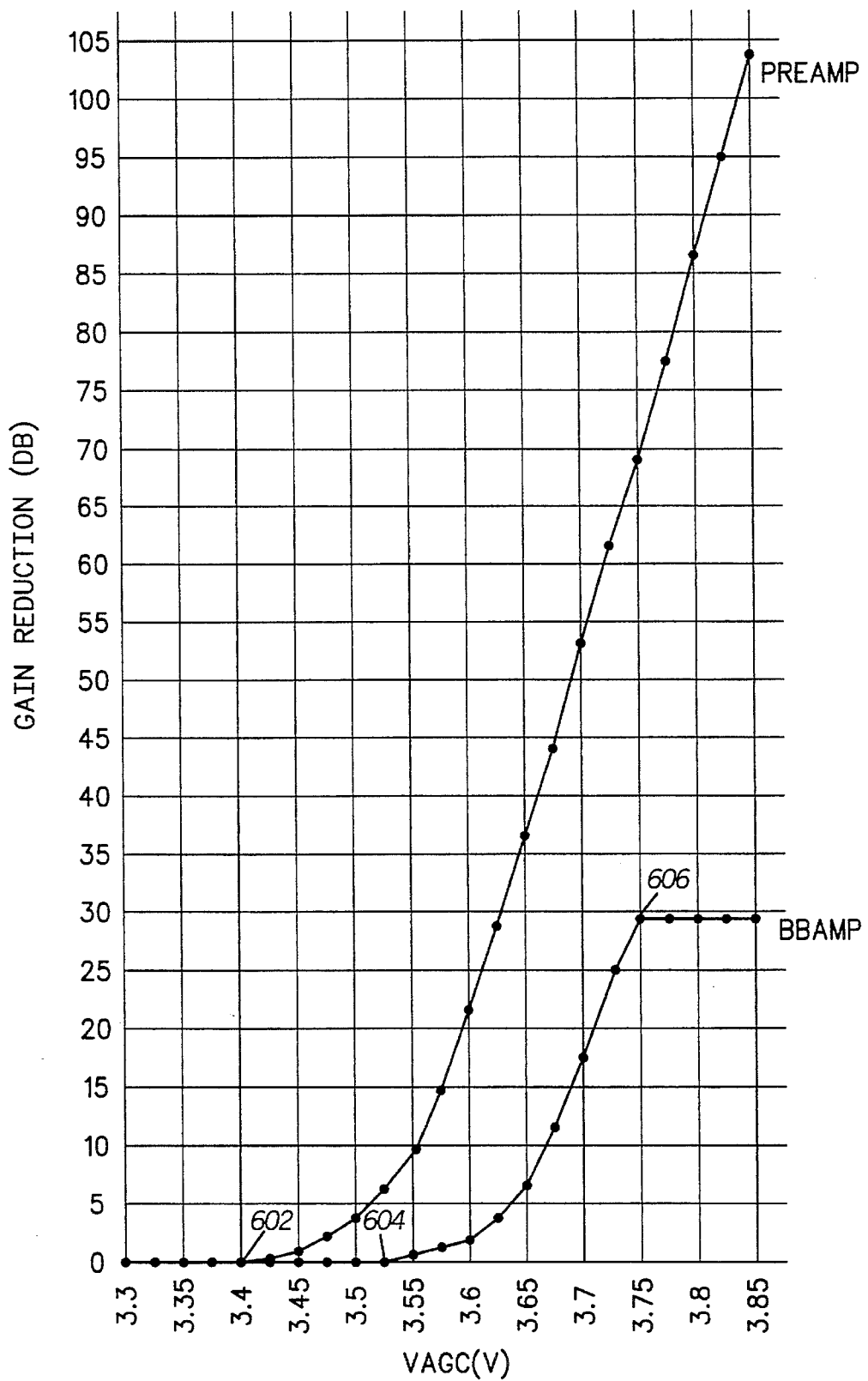
FIG. 6 is a chart showing the IF preamplifier and base-band amplifier gain reduction as a function of the AGC control voltage.

In FIG. 6, a chart showing the gain reduction applied to the IF preamplifier 158 and baseband amplifiers 114 and 118 versus VAGC voltage level is shown. It can be seen that the gain reduction for baseband amplifiers 114 and 118 begins at a higher VAGC voltage level as compared to the IF preamplifier 158. In this particular example, the gain reduction for the IF preamplifier 158 begins at a first threshold level 602 which is at approximately 3.4 volts, while the gain reduction at the baseband amplifiers 114 and 118 start at a second threshold level 604 which is at approximately 3.525 volts. Control circuit 116 controls when the baseband amplifier begins gain reduction as compared to when gain reduction at the IF preamp occurs by providing the modified VCNTRL voltage level to the baseband amplifiers 114 and 118.

Also, the amount of bias reference current (IREF in FIG. 5) applied to the control circuit 116 will set the level at which no more gain reduction will be allowed at the baseband amplifier 114 (or amplifier 118). Point 606 which is the predetermined gain reduction limit threshold level shows that in this particular example, control circuit 116 clamps gain reduction at approximately 29 dB (decibel) for the baseband amplifiers 114 and 118.

By controlling when gain control at one stage is applied in relationship to when gain control is applied to a second stage (as shown by points 602 and 604) and also controlling the maximum gain reduction applied to the second stage (point 606) the present invention allows for optimization of the receiver's signal to noise ratio under large received signal conditions, such as when two radios are communicating in close proximity to each other.

Figure 7:
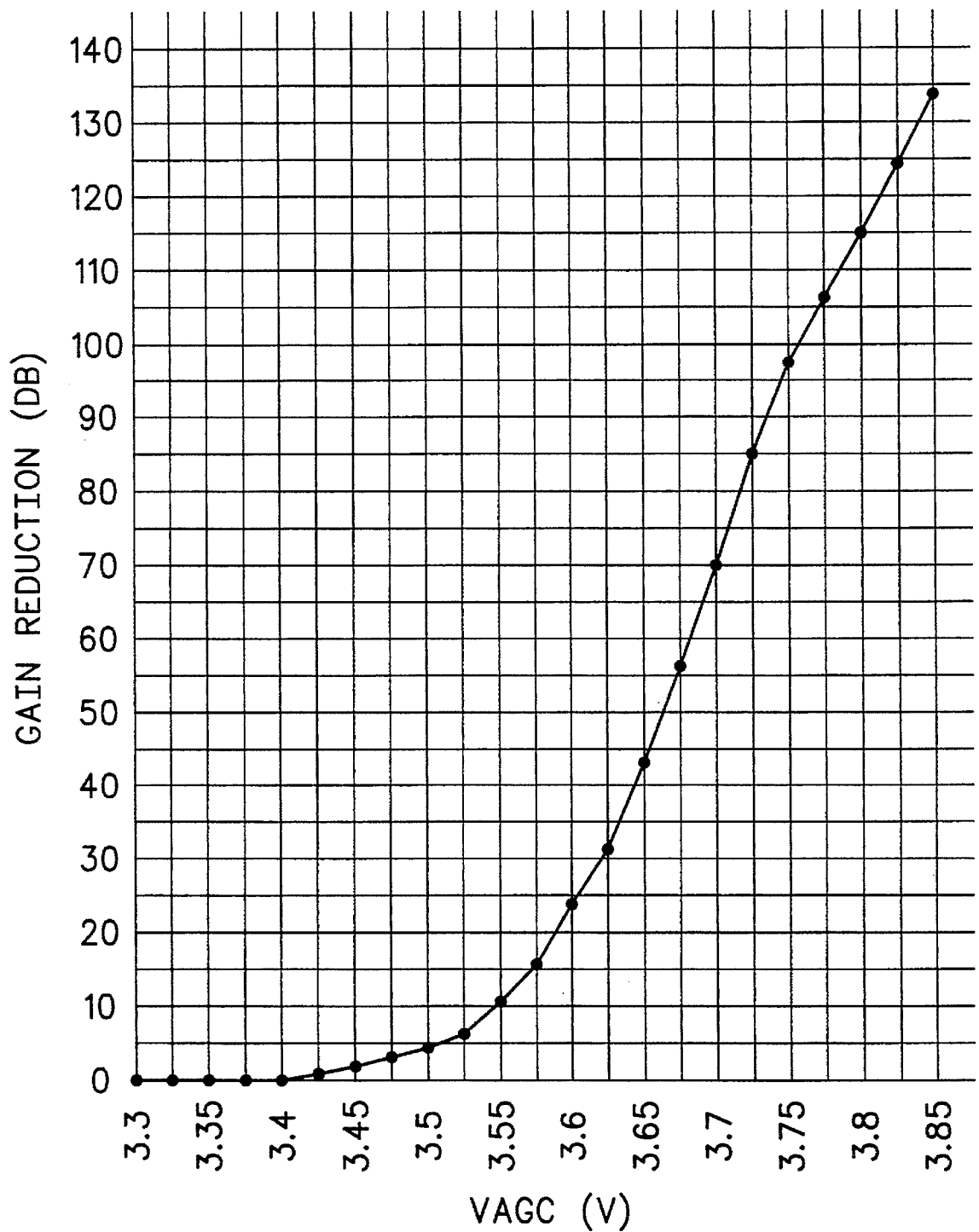
FIG. 7 is a chart showing the overall system gain reduction as a function of the AGC control voltage.

In FIG. 7 the total system gain reduction versus VAGC voltage level for the receiver of FIG. 1 is shown. FIG. 7 is a combination of the two gain reduction lines shown in FIG. 6.

In summary, the present invention allows for a simple and efficient way of controlling the gain in multiple stages of a receiver string. By controlling the gain of the different gain control stages differently in relationship to each other, allows for better receiver performance optimization. Control circuit 116 allows for also controlling the maximum amount of gain control (in this case gain reduction) applied to the second gain adjustment stage (baseband amps 114 and 118). Although, the preferred embodiment has shown only two gain control stages (IF pre-amp 158 being the first stage and the baseband amps 114 and 118 being the second stage) more gain control stages can be used and controlled relative to each other. Furthermore, the control circuit 116 and the individual gain control stages can have a microprocessor or other similar control device dynamically control the VAGC voltage in order to control the amount of gain reduction (or increase in gain) at each of the stages. The limiting of the amount of gain control allowed (as shown in 606 in FIG. 6) at any particular stage could also be controlled dynamically or be fixed as shown in the preferred embodiment.

What is claimed is:

1. A zero intermediate frequency (zero IF) receiver, comprising:

a first adjustable gain stage having an input terminal for receiving an input signal, the first adjustable gain stage being responsive to a gain control signal for adjusting the amount of gain provided to the input signal and providing an amplified output signal at an output terminal;

first and second down mixers coupled to the output terminal of the first adjustable gain stage and providing first and second phase-related baseband signals;

a second adjustable gain stage for receiving the first and second phase-related baseband signals and providing first and second amplified baseband signals in response to a modified gain control signal;

a control means coupled to the first and second adjustable gain stages and responsive to the gain control signal for providing the modified gain control signal to the second adjustable gain stage for adjusting the gain of the second adjustable gain stage depending on the level of the modified gain control signal, the control means including a limiting means for limiting the maximum amount of gain reduction applied to the second adjustable gain stage upon the gain control signal reaching a predetermined gain reduction limit threshold level, wherein the gain of the first adjustable gain stage is reduced prior to the gain of the second adjustable gain stage;

first and second up mixers for converting the first and second amplified baseband signals into first and second amplified phase-related signals; and an adder for summing the first and second amplified phase-related signals to produce the gain control signal.

2. A receiver as defined in claim 1, wherein the first adjustable gain stage begins to have its gain reduced upon the gain control signal reaching a first threshold level and the second adjustable gain stage has its gain reduced upon the gain control signal reaching a second threshold level.

3. A receiver as defined in claim 2, wherein the second threshold level is greater than the first threshold level causing the first adjustable gain stage to begin gain reduction at a lower gain control signal level than the second adjustable gain stage.

4. A receiver as defined in claim 2, wherein the first adjustable gain stage comprises an intermediate frequency (IF) preamplifier.

5. A zero intermediate frequency receiver as defined in claim 1, wherein the limiting means comprises:
   an operational amplifier having an input terminal for receiving the gain control signal and an output terminal for providing the modified gain control signal;
   a current reference; and
   a set of current mirrors coupled to the current reference and responsive to the modified gain control signal; and
   switching means coupled to the current mirrors and modified gain control signal for limiting the signal level of the modified gain control signal.

6. A zero intermediate frequency (zero IF) receiver, comprising:
   a preamplifier having an input terminal for receiving an input signal, the preamplifier being responsive to a gain control signal for adjusting the amount of gain provided to the input signal and providing an amplified output signal at a preamplifier output terminal;
   first and second down mixers coupled to the preamplifier output terminal and providing first and second phase-related baseband signals;
   a baseband amplifier for receiving the first and second phase-related baseband signals and providing first and second amplified baseband signals in response to a modified gain control signal;
   a control means responsive to the gain control signal for providing the modified gain control signal to the baseband amplifier for adjusting the gain of the baseband amplifier depending on the level of the modified gain control signal, the control means including a limiting means for limiting the maximum amount of gain reduction applied to the baseband amplifier, said gain control signal reducing the gain of the preamplifier prior to the baseband amplifier's gain being reduced by the modified gain control signal;
   first and second up mixers for converting the first and second amplified baseband signals into first and second amplified phase-related signals; and
   an adder for summing the first and second amplified phase-related signals to produce the gain control signal.

7. A receiver as defined in claim 6, wherein the limiting means limits the maximum amount of gain reduction applied to the baseband amplifier upon the gain control signal reaching a predetermined gain reduction limit threshold level thereby causing all further receiver gain reduction to take place at the preamplifier.

8. A zero intermediate frequency (zero IF) receiver as defined in claim 6, further comprising a limiter for normalizing the gain of the zero IF receiver.

* * * * *